United States Patent [19]
Griffith, Jr. et al.

[11] Patent Number: 4,598,418
[45] Date of Patent: Jul. 1, 1986

[54] SOUND SYSTEM EMPLOYING AUTOMATIC PROPORTIONAL AMPLIFICATION

[76] Inventors: Eugene R. Griffith, Jr., 1 Berthe Cir., Colorado Springs, Colo. 80906; Steven T. Connett, 1717 Van Diest Rd., Colorado Springs, Colo. 80915

[21] Appl. No.: 788,092

[22] Filed: Oct. 15, 1985

Related U.S. Application Data

[63] Continuation of Ser. No. 699,213, Feb. 5, 1985, abandoned, which is a continuation of Ser. No. 457,419, Jan. 12, 1983, abandoned.

[51] Int. Cl.⁴ ............................................. H04R 27/00
[52] U.S. Cl. ......................................... 381/83; 381/85
[58] Field of Search ..................... 381/80, 81, 83, 85, 381/93, 104, 107, 108, 110; 179/100 L

[56] References Cited

U.S. PATENT DOCUMENTS

| | | |
|---|---|---|
| 3,508,007 | 4/1970 | Goodall et al. |
| 3,992,584 | 11/1976 | Dugan ........................... 381/93 X |
| 4,068,092 | 1/1978 | Ikoma et al. .................. 381/104 X |
| 4,184,048 | 1/1980 | Alcaide ............................... 381/83 |
| 4,449,238 | 5/1984 | Lee et al. ........................... 381/110 |

Primary Examiner—Keith E. George
Attorney, Agent, or Firm—William E. Hein

[57] ABSTRACT

A sound system for use in government council chambers, corporate board rooms, and the like employs low level switching of the audio signal to selectively attenuate the audio output of a given speaker or group of speakers as a function of the source of that audio signal.

4 Claims, 2 Drawing Figures

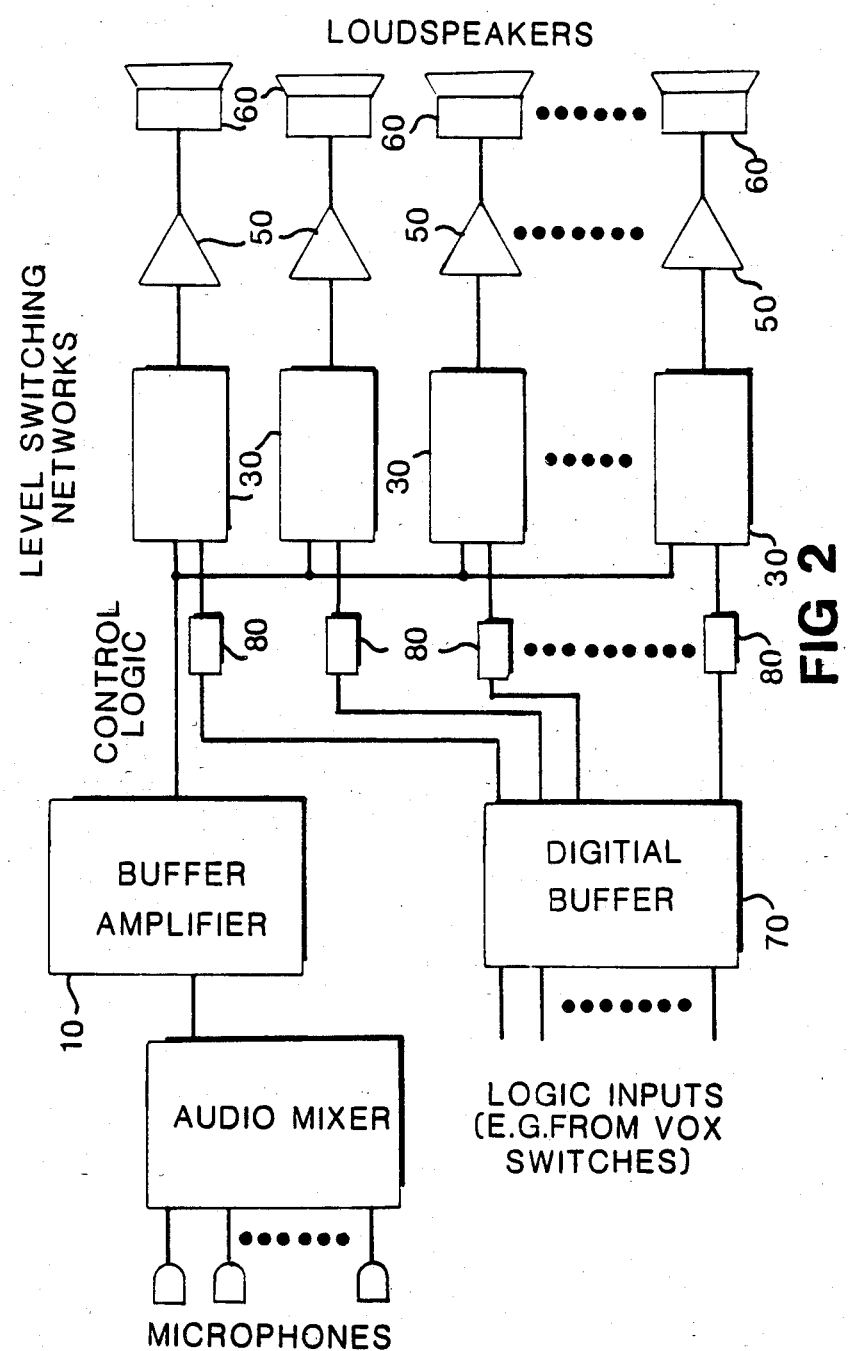

SOUND SYSTEM EMPLOYING AUTOMATIC PROPORTIONAL AMPLIFICATION

CROSS REFERENCE TO RELATED APPLICATION

This application is a continuation of application Ser. No. 699,213, filed Feb. 5, 1985, now abandoned, which is a continuation of application Ser. No. 457,419, filed Jan. 12, 1983, now abandoned.

BACKGROUND AND SUMMARY OF THE INVENTION

This invention relates generally to sound systems for use in meeting rooms such as government council chambers and corporate board rooms. More specifically, this invention is directed to such a sound system in which multiple signal sources such as microphones and multiple loudspeakers are employed to facilitate voice pickup and distribution throughout the meeting room. Typically, such a system utilizes a microphone at every seat as well as at a podium or lectern and a loudspeaker proximate every microphone location as well as at various other locations within the meeting room. Without adjusting the audio level of a loudspeaker or group of loudspeakers located proximate to a particular microphone that is being used, audio feedback occurs that produces an undesirable and disruptive squeal in the audio system. It is therefore desirable and, hence, is a principal object of the present invention to provide a sound system in which the audio level of each loudspeaker or group of loudspeakers located proximate to a microphone in use is automatically proportionately attenuated to prevent unwanted audio feedback in the sound system and to provide a comfortable audio level for those listeners seated near the person speaking into that microphone.

This and other objects of the present invention are accomplished by providing a sound system that employs control logic to effect low level switching of the audio signal to selectively attenuate the audio output of a given loudspeaker or group of loudspeakers as a function of the source of that audio signal. By employing low level switching in accordance with the teachings of the present invention, improved efficiency is achieved by avoiding the use of high power loss elements such as relays, power resistors, and transformers. In addition, the sound system of the present invention has the advantages of silent switching, low power requirements, lower construction cost, and improved reliability.

DESCRIPTION OF THE DRAWING

FIG. 2 is a detailed block diagram of a multichannel sound system, each of the channels of which employs a portion of the circuitry of FIG. 1.

DESCRIPTION OF THE PREFERRED EMBODIMENT

Figure 1:
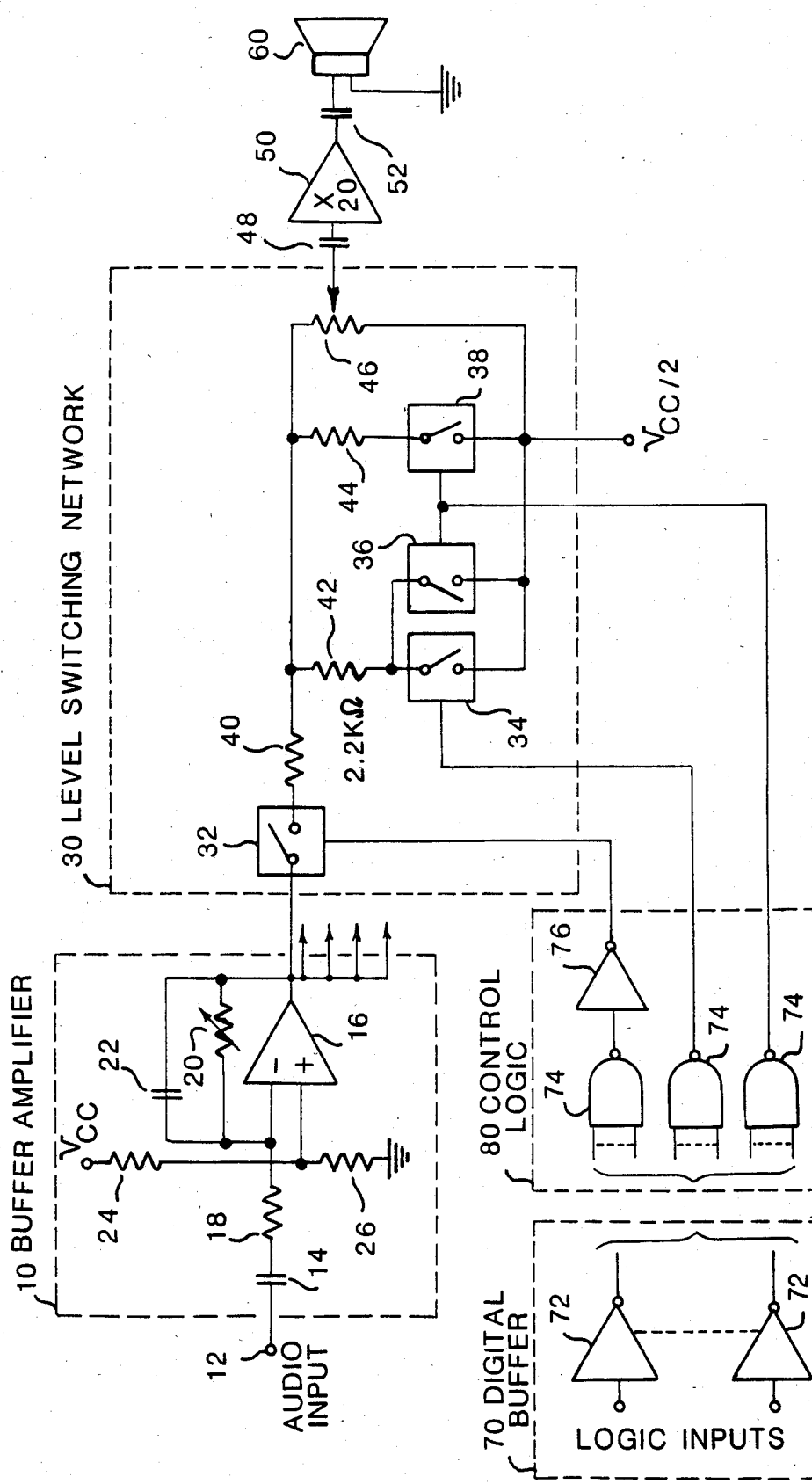
FIG. 1 is a detailed schematic diagram of a typical channel of a multichannel sound system employing automatic proportional amplification in accordance with the present invention.

Referring now to the detailed schematic diagram of FIG. 1, as well as to the detailed block diagram of FIG. 2, there is shown a buffer amplifier 10 for receiving an audio input signal 12. Audio input signal 12 may originate from a single source such as a microphone or tape recorder or it may originate from a plurality of sources through a conventional audio mixer. Audio input signal 12 enters buffer amplifier 10 through a blocking capacitor 14 and is buffered by a conventional operational amplifier 16 that may comprise, for example, a National Semiconductor LM324 operational amplifier. Use of the LM324, which requires a single power supply voltage, was chosen so that the same power supply could be used to power all logic, switching, and amplifier circuitry. In this case, resistors 24 and 26 are selected to center the output voltage of buffer amplifier 10 at 2.5 volts D.C. Gain control and/or equalization may be accomplished in buffer amplifier 10 through the use of resistors 18 and 20 and capacitor 22. As indicated in FIG. 1, the output of buffer amplifier 10 may be routed to as many channels as desired so long as the operating limitations of operational amplifier 16 are not exceeded.

The output of buffer amplifier 10 is fed to one or more level switching networks 30 that controls the attenuation applied to loudspeaker or group of loudspeakers 60. Level switching network 30 includes four analog switches 32, 34, 36, and 38 that may comprise, for example, a single RCA CD4066 quad analog switch. Analog switch 32 provides simple on/off control. The combination of resistors 40, 42, 44, and 46 and analog switches 34, 36, and 38 provide 3 decibels (db) and 6 db of audio signal attenuation and permits an output amplifier 50, which may comprise a National Semiconductor LM378, to operate within its stable range. Additional discrete levels of audio signal attenuation, if desired in a particular system configuration, may be provided by those having ordinary skill in the art through the use of additional analog switches and associated divider resistors. Resistors 40 and 46 comprise a voltage divider presenting a sufficiently high impedance to prevent excessive loading of operational amplifier 16 while providing output level control by way of variable resistor 46. In order to provide approximately 3 db of audio signal attenuation, analog switch 34 is closed, thereby connecting resistor 42 in parallel with resistor 46. Similarly, in order to provide approximately 6 db of attenuation, analog switches 36 and 38 are closed, thereby connecting resistors 42 and 44 in parallel with resistor 46. Each one of analog switches 34, 36, and 38 is returned to a stable power supply voltage that is equal to the output of operational amplifier 16 to prevent DC level shifts. The audio signal thus attenuated is AC coupled into a line amplifier 50 via a capacitor 48 and out of line amplifier 50 to loudspeaker 60 via a capacitor 52. The frequency response of line amplifier 50 may be tailored in a conventional manner through the use of feedback components associated therewith. Line amplifier 50 may comprise any conventional line amplifier. Loudspeaker 60 may comprise a single loudspeaker or a group of loudspeakers to which it is desired in a particular sound system configuration to feed the same attenuated audio signal.

Logic inputs indicating which microphone or other source of audio signal is active are applied to a digital buffer 70. Such logic inputs may originate with any device having a logic compatible voltage output that operates in conjunction with an audio signal. Exemplary of such a logic input source is a conventional VOX (voice operated switch) circuit. Digital buffer 70 comprises a plurality of logic inverters 72 that may comprise, for example, off-the-shelf 74LS04 TTL logic inverters. The number of logic inverters 72 required is dependent upon the number of microphones or other sources of audio signal that are included in a particular sound system configuration. The outputs of logic inverters 72 are coupled to control logic 80 that may comprise three off-the-shelf NAND gates 74 such as the 74LS00, 74LS20, 74LS30, etc. The output of one of NAND gates 74 is coupled through a conventional inverter 76 to analog switch 32. The output of another of NAND gates 74 is coupled to analog switch 34, and the output of the remaining NAND gate 74 is coupled to analog switches 36 and 38. The number of inputs required of each of NAND gates 74 is a function of the number of logic inputs required by a particular sound system configuration. Alternatively, control logic 80 may comprise field programmable diode pin matrices or matrix switches rather than the hard wired NAND gates 74 described hereinabove. The connections between the outputs of logic inverters 72 and NAND gates 74 may be readily accomplished by those persons having ordinary skill in the art based upon the way in which a particular sound system is configured.

Exemplary of the utility of the present invention is in a large meeting room having a sound system configured in a manner by which a separate microphone is located at each seat position and at a central podium and also by which loudspeakers are located in the ceiling of the meeting room and on a desk adjacent each microphone. By employing a conventional automatic audio mixer as the source of logic inputs to digital buffer 70 to indicate the activation of each of the various microphones in the room, the various loudspeakers may be automatically proportionately adjusted. For example, when a particular microphone is activated the loudspeaker directly overhead may be controlled by a first level switching network 30 to be turned off. At the same time, the loudspeaker on the desk adjacent that microphone as well as two of the ceiling loudspeakers next most proximate to that microphone may be controlled by a second level switching network 30 such that their output is attenuated by 6 db. At the same time, the group of loudspeakers next most proximate to that microphone may be controlled by a third level switching network 30 such that their output is attenuated by 3 db. All other loudspeakers in the meeting room would be controlled by their respective associated level switching network 30 to operate at the normal output level without attenuation. By so proportionately adjusting the output of the various loudspeaker groups adjacent the activated microphone, disruptive audio feedback is prevented and a more natural sound level is presented to those persons seated adjacent to the person presently speaking into his microphone.

We claim:

1. A multichannel sound system for providing voice pickup and distribution in a common area, the system comprising:
    a plurality of audio signal sources, an active one of which provides an audio input signal;
    a plurality of loudspeakers for distributing sound represented by said audio input signal in the same general area as that in which said plurality of audio signal sources is located, at least one of said plurality of loudspeakers being separately associated with and located in close proximity to each one of said plurality of audio signal sources;
    a plurality of line amplification means, each of which is coupled to one or more of said plurality of loudspeakers and adapted to receive said audio input signal;
    a plurality of level switching networks, each of which is coupled between said plurality of audio signal sources and one of said plurality of line amplification means for selectively attenuating the audio input signal before it is applied to said plurality of line amplification means;
    logic source means for supplying a logic input signal indicative of which of said plurality of audio input signal sources is active; and
    a plurality of control logic means, each of which is coupled to receive said logic input signal and is further coupled to an associated one of said plurality of level switching networks for selectively controlling the level of attenuation of said audio input signal by that level switching network.

2. A multichannel sound system as in claim 1 wherein each of said level switching networks comprises a plurality of semiconductor switches and one or more resistive divider networks for providing incremental levels of attenuation of the audio input signal.

3. A multichannel sound system as in claim 2, further comprising:
    audio mixer means coupled to said plurality of audio signal sources; and
    buffer amplifier means coupled between said audio mixer means and each of said plurality of level switching networks.

4. A multichannel sound system as in claim 3 wherein said logic source means comprises a voice operated switch circuit.

* * * * *